(12) United States Patent
Park et al.

(10) Patent No.: US 6,475,646 B2
(45) Date of Patent: Nov. 5, 2002

(54) LEAD FRAME AND METHOD OF MANUFACTURING THE LEAD FRAME

(75) Inventors: Se-chul Park, Changwon (KR); Dong-il Shin, Changwon (KR); Sung-il Kang, Changwon (KR); Sang-hoon Lee, Changwon (KR); Bae-soon Jang, Changwon (KR)

(73) Assignee: Samsung Techwin Co., Ltd., Kyongsangnam-do (KR)

( * ) Notice: Subject to any disclaimer, the term of this patent is extended or adjusted under 35 U.S.C. 154(b) by 34 days.

(21) Appl. No.: 09/731,766

(22) Filed: Dec. 8, 2000

(65) Prior Publication Data

US 2002/0020629 A1 Feb. 21, 2002

(30) Foreign Application Priority Data

Aug. 17, 2000 (KR) ........................................ 2000-47498

(51) Int. Cl.[7] .............................. B32B 15/20; C25D 5/34
(52) U.S. Cl. ................... 428/670; 428/672; 428/687; 428/675; 205/205; 205/206; 205/210; 205/219
(58) Field of Search ................................. 205/205, 206, 205/210, 219; 428/680, 672, 687, 612, 596, 600, 670, 675; 257/666; 29/827

(56) References Cited

U.S. PATENT DOCUMENTS 5,167,794 A * 12/1992 Ito ............................ 148/518
5,660,708 A * 8/1997 Tezuka et al. ............... 205/205
5,843,290 A * 12/1998 Tezuka et al. ............... 204/206

FOREIGN PATENT DOCUMENTS

| JP | 60-225455 | * 11/1985 |
| JP | 03-068788 | * 3/1991 |
| JP | 08-066830 | * 3/1996 |
| JP | 08-168924 | * 7/1996 |
| JP | 09-064264 | * 3/1997 |
| JP | 10-237694 | * 9/1998 |

* cited by examiner

Primary Examiner—John J. Zimmerman
(74) Attorney, Agent, or Firm—Finnegan, Henderson, Farabow, Garrett & Dunner LLP

(57) ABSTRACT

A method for manufacturing a lead frame including the steps of electrocleaning the surface of a thin plate material, electropolishing the electrocleaned thin plate material, removing inclusions on the surface of the electropolished thin plate material, rinsing the inclusion-removed thin plate material with an acidic solution, and forming multi-plated layers on the rinsed material. The lead frame manufactured by the method has 5 or less inclusions each having approximately 1 $\mu$m, on the surface area of 1600 $\mu m^2$, which impede a wire bonding property or solder wettability of the lead frame.

9 Claims, 8 Drawing Sheets

LEAD FRAME AND METHOD OF MANUFACTURING THE LEAD FRAME

BACKGROUND OF THE INVENTION

1. Field of the Invention

The present invention relates to a semiconductor lead frame, and more particularly, to a lead frame having an improved pre-treatment process and a plating method of the lead frame.

2. Description of the Related Art

A semiconductor lead frame is an important element of a semiconductor package, together with semiconductor chips, and connects the inside of the semiconductor package and the outside thereof and supports the semiconductor chips. A semiconductor lead frame is generally manufactured by a stamping process or an etching process.

A semiconductor lead frame manufactured by one of the two processing methods has a variety of structures according to the type of being mounted on a substrate.

Figure 1:
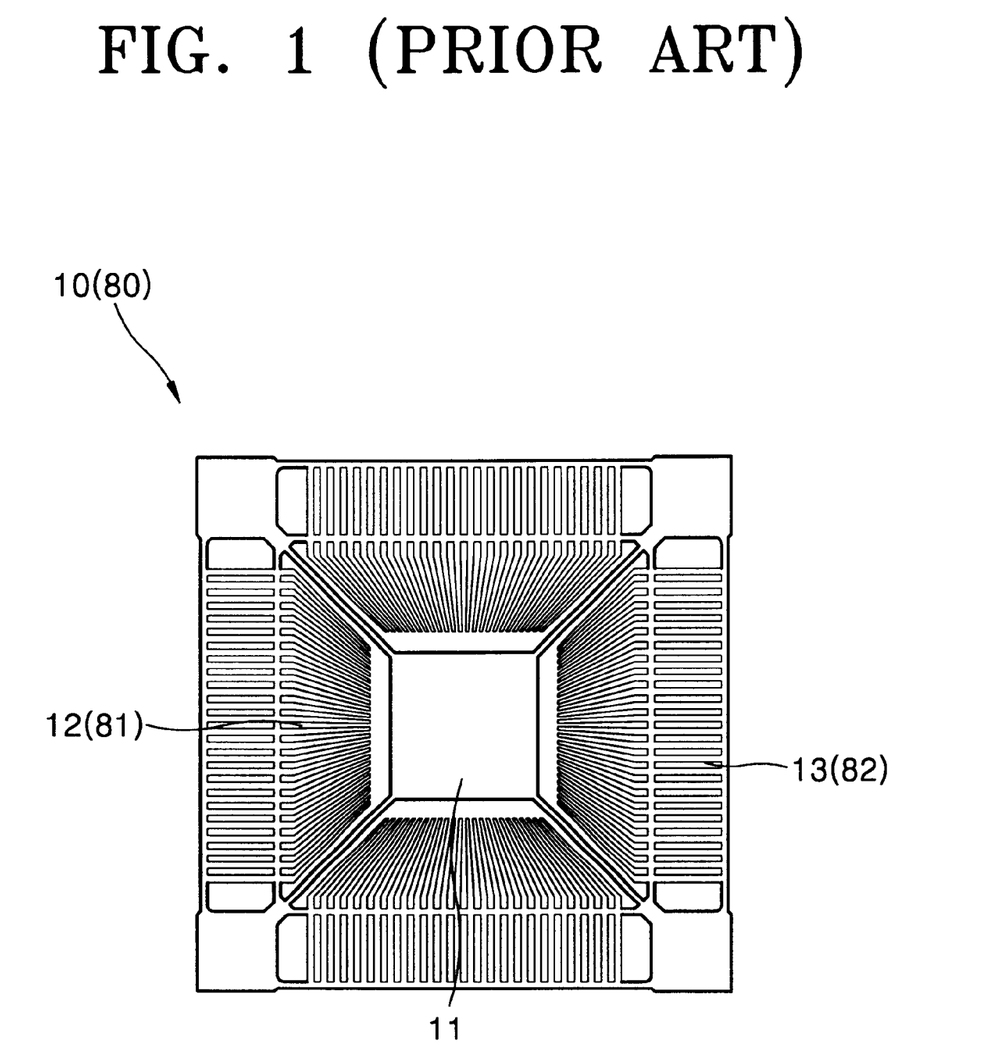
FIG. 1 is a schematic plan view illustrating a general semiconductor lead frame.

FIG. 1 is a schematic plan view illustrating the structure of a conventional semiconductor lead frame.

Referring to the drawing, a semiconductor lead frame 10 includes a die pad unit 11 for mounting a semiconductor memory chip and fixing the same at a static state, an internal lead 12 connected to the chip by wire bonding, and an external lead 13 for connection with an external circuit.

The semiconductor lead frame 10 having the aforementioned configuration forms a semiconductor package through assembly with other parts of the semiconductor, e.g., a memory chip. In the course of assembling the semiconductor package, in order to improve a wire bonding property between the semiconductor chip and the internal lead 12 of the lead frame 10 and a solderability of the die pad unit 11, a metal material having a predetermined property is often plated on the die pad unit 11 and the internal lead 12 of the lead frame 10. Also, in order to improve solderability for substrate mounting after molding a resin protective layer, solder (Sn—Pb) plating is performed on a predetermined portion of the external lead 13.

However, during the solder plating, a plating solution frequently encroaches on a region of the external lead 13, so that an extra step of removing the encroachment of the plating solution is necessary.

To solve this problem, a pre-plated frame (to be referred to as "PF" hereinafter) method, as disclosed in Japanese Patent Publication No. Showa 63-2358, has been suggested. According to the PPF method, before a semiconductor packaging process, a substrate made of a material having good solder wettability is previously formed to form an intermediate plating layer.

As described above, in the pre-plated lead frame, since plating is performed over the entire surface of a thin plate material, a pretreatment process is performed before plating. The pre-treatment process is performed for improving adhesiveness between plating layers by cleaning and flattening the plated surface. If the pre-treatment process is incompletely performed, it sometimes happens that various kinds of defects such as generation of peeling or swelling of a plating layer, non-uniform spots and gloss, roughness of a plating layer, or the generation of pinholes.

The pre-treatment process for suppressing the generation of the above-described defects is generally electrocleaning including an organic solvent degreasing step, an inorganic matter degreasing step, an acid submerging step and a rinsing step. Also, in order to increase the surface adhesiveness between a raw material and a plating layer, electroplating is additionally performed after the electrocleaning, thereby activating the surface of the raw material.

The electroplating process activates the surface of a base metal to increase an interface bondability between a nickel plated layer and the base metal during nickel plating. The manufacture stress of the raw material of a semiconductor lead frame manufactured by rolling is not completely removed even if unwinding is performed, and local microcracks or local stress may exist on the surface of the raw material.

Even if a degreasing process for removing an anti-corrosive oil or inorganic matter present on the surface of the raw material, is performed on the base metal, microcracks still remain thereon. If conventional multi-layer plating is performed on the surface, the surface of the plating layer becomes relatively flattened. However, if a lead frame is bent in order to mount a semiconductor on a substrate, the stress and microcracks remaining on the surface of the base metal increase by the bending process, leading to increased microcracks to cause cracks to plating layers deposited on the surface of the base metal, thereby resulting in corrosion and oxidation of the base metal. Also, even if microcrack portions and stress remainder portions are plated, the microcrack portions are not completely plated and pores may remain. If the pores are exposed to deteriorating conditions, such as heat applied during a semiconductor manufacturing process, corrosion due to microcracks is expedited. Also, corrosion of raw materials of a lead frame may occur due to internal heat caused by continuous operation of semiconductor circuits. Further, cracks may grow over time by the remaining internal bending stress. Thus, the microcracks remaining on the surface of the base metal are etched by electropolishing, thereby removing the microcracks and the remaining stress portions. In this case, if a protective plating layer deposited on the surface of the base metal is considerably thick, the above-noted problems may be prevented to an extent. However, if the underlying plating and protective plating layer are thick, solder wettability is lowered and cracks may be caused during bending.

Figure 2:
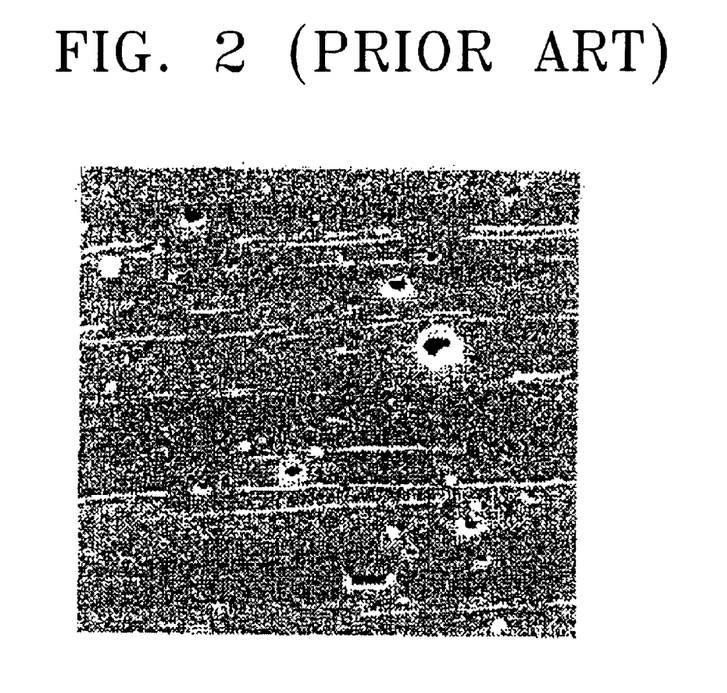
FIG. 2 is a photograph view showing the state of a surface of a conventional thin plate material after electropolishing.
Figure 3:
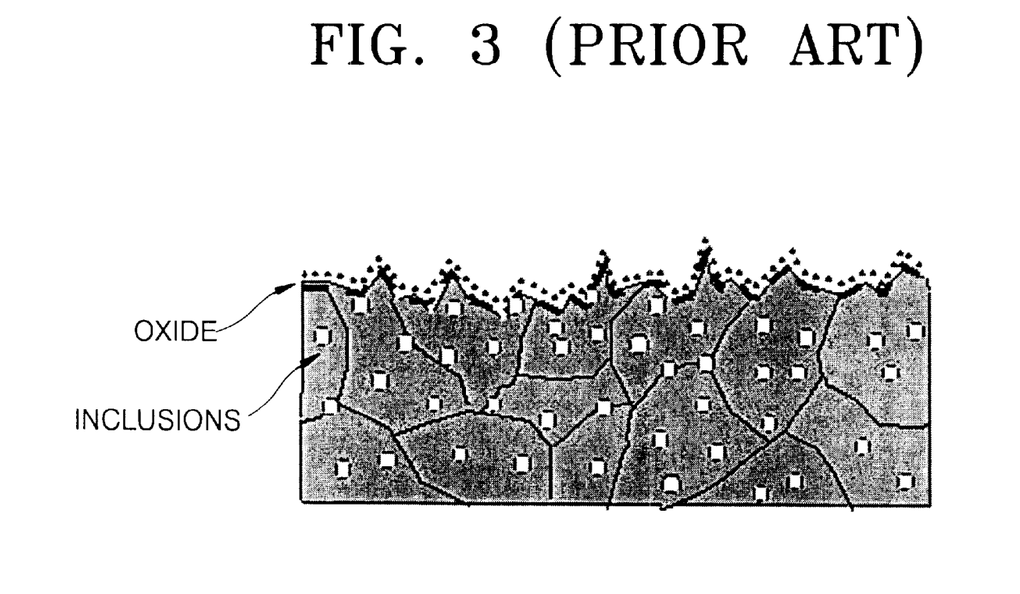
FIG. 3 is a cross-sectional view illustrating the cross section of a material before a pre-treatment process.
Figure 4:
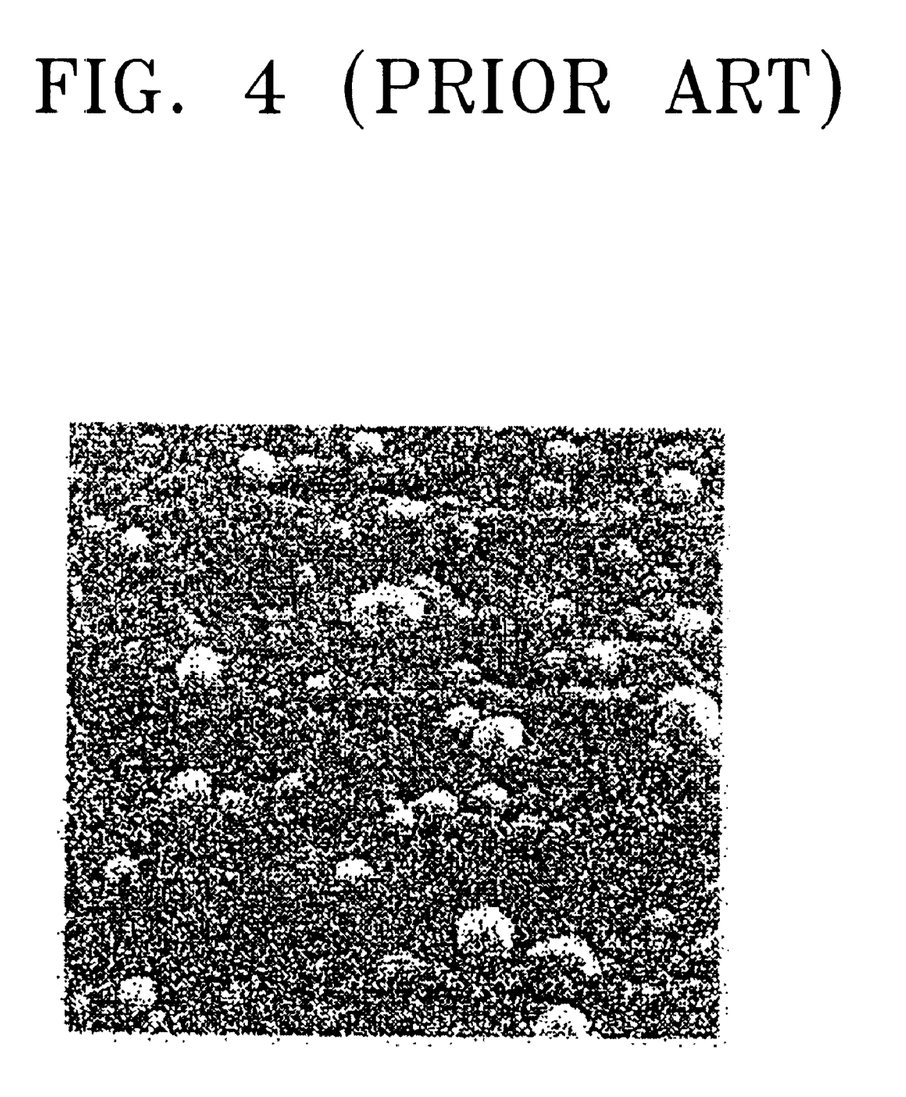
FIG. 4 is a photograph showing the state in which a plating layer is formed on the surface of a thin plate material after electropolishing.

However, if electropolishing is performed during the pre-treatment process, inclusions of metal or nonmetal in the thin plate material are exposed to the surface of the thin plate material, as shown in FIGS. 2 and 3. In other words, since alloy element materials added during manufacture as well as main underlying metal material are compressed on the surface of the thin plate material together with raw materials when rolling the thin plate material, they do not protrude and are not shown due to a surface oxide layer, an anti-corrosive oil or inorganic matter. However, the surface of the thin plate material is electropolished, the inclusions are exposed to the surface. In the exposed state, if plating of nickel (Ni) or the like is performed, nodules which are scattered through the surface of the thin plate material, are plated, as shown in FIG. 4. Since the thus-plated nodules are weakly bonded at interfaces with underlying metal during bending of the thin plate material, they may be separated from bonding. Also, when a semiconductor device is finally mounted on the surface of a substrate, solder wettability may be lowered due to an aging process applied to a lead frame during the manufacture of the semiconductor device. In the case where the inclusion present on the surface of the base metal is iron (Fe) as in this embodiment, Fe is oxidized more easily than copper (Cu) which is a main material, due to heat applied during manufacture of the semiconductor device, and the thermal diffusion leads to an upper plating layer to then be diffused to the surface of the plating layer, thereby lowering the solder wettability. Also, the plating layer may be peeled from the nodules due to a mechanical shock caused by a capillary or thermal pressure during wire bonding. Also, the peeled nodules are electrodeposited on the head portion of the capillary so that the capillary is severely contaminated or abraded, thereby causing the necessity of replacing capillaries often. Moreover, during wire bonding, even the bottom layer of the bonded part of a plated lead frame may be damaged due to the nodules electrodeposited on the capillary. Conventionally, this problem has not been generated by forming a thick multi-layer plated layer even if inclusions remain on the surface of the base metal. To avoid the occurrence of the problem, in the conventional pre-plated lead frame, a nickel plating is formed as an underlying layer and then a protective layer is plated as a functional plating layer. However, if the protective plating layer becomes thicker, a standby time for adhesion between the underlying layer at which solder wetting is actually performed, and the solder, is delayed, thereby lowering solder wettability. A Pd plating as a protective layer is generally formed to a thickness of 6 to 7 μm. In this case, the above-mentioned problem is generated due to the inclusion on the surface of the base metal. In the pre-plating which has been recently in widespread use, increasing the plating layer extremely lowers the commercial availability due to a rise in the price of palladium (Pd) which has been widely used as a protective plating layer.

SUMMARY OF THE INVENTION

To solve the above problems, it is an object of the present invention to provide a method of manufacturing a lead frame which can improve corrosion resistance, suppress generation of nodules exposed during electropolishing, increase interface adhesiveness during formation of a plating layer and can form a flat plating layer.

It is another object of the present invention to provide a lead frame for a semiconductor device having excellent wire bondability and solder wettability while having a thin protective plating layer in a multi-layer plated lead frame.

It is still another object of the present invention to provide a lead frame made of a material formed by the manufacturing method.

Accordingly, to achieve the first object, there is provided a method for manufacturing a lead frame including the steps of electrocleaning the surface of a thin plate material, electropolishing the electrocleaned thin plate material, removing inclusions on the surface of the electropolished thin plate material, rinsing the inclusion-removed thin plate material with an acidic solution, and forming multi-plated layers on the rinsed material.

In the present invention, the inclusion-removing step includes the step of anodic-degreasing the thin plate material.

To achieve the second object, there is provided a lead frame having an inner lead portion and an outer lead portion formed by electropolishing a cleaned thin plate material, removing inclusion on the surface of the electropolished thin plate material having multi-plated layers, rinsing the same and forming multi-plated layers thereon.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

A preferred embodiment of the present invention will now be described with reference to the accompanying drawings.

Figure 5:
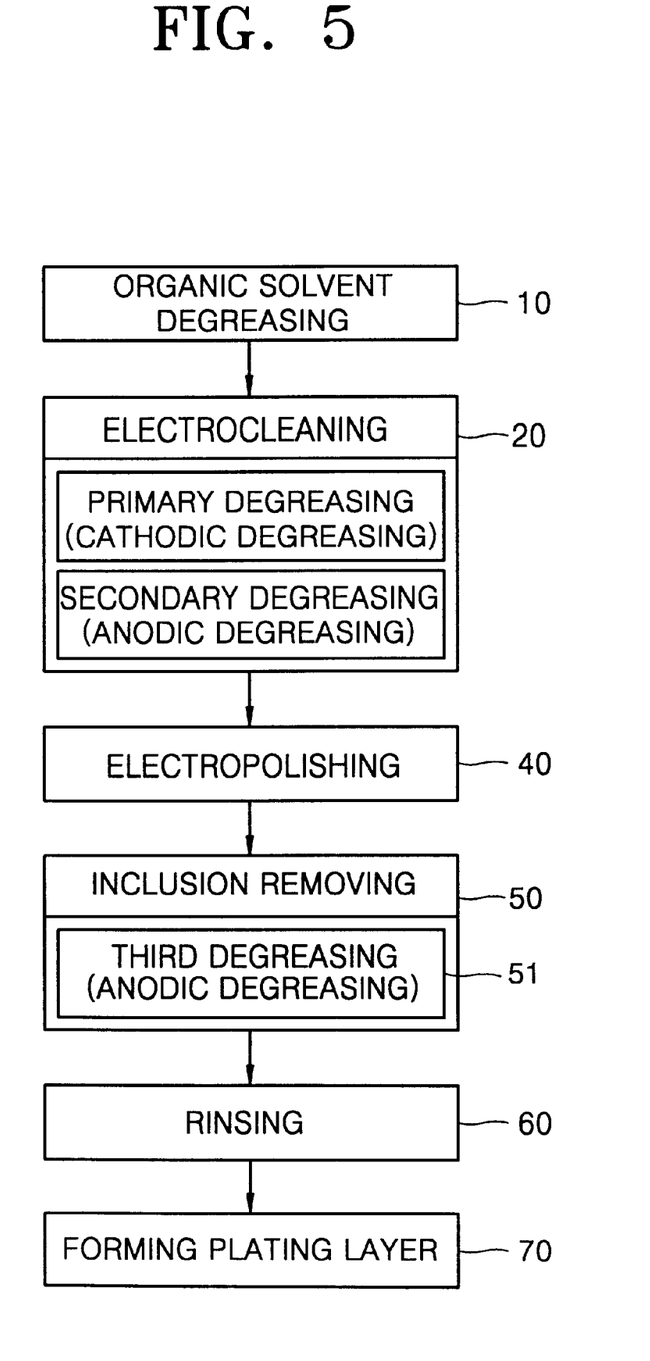
FIG. 5 is a block diagram illustrating the pre-treatment process in a manufacturing method of a lead frame according to the present invention.

A method of manufacturing a lead frame according to the present invention relates to a method of pre-treating a thin plate material for forming the lead frame, and an embodiment thereof is shown in FIG. 5.

The pre-treatment process of the present invention includes a process of removing oil such as rolling oil or anti-corrosive oil in a raw material. To this end, the thin plate material is treated with organic solvent degreasing (step 10) and alkali submerging or electrocleaning (step 20). The electrocleaning (step 20) may include the sub-steps of primary degreasing (cathodic dereasing), and secondary degreasing (anodic degreasing on cathodic-degreased thin-plate material). The electrocleaning (step 20) may consist of cathodic degreasing only.

In this embodiment, the electrocleaning (step 20) is performed by the primary degreasing (cathodic dereasing), and the secondary degreasing (anodic degreasing on anode-degreased thin plate material). A current of 90 A is applied to an electrolytic solution of the electrocleaning step which is an alkaline solution, that is, a 120 g/l of NaOH solution, and then an anode and a cathode are employed to each electrolyte bath by non-contact degreasing. In this case, a current is applied to the thin plate material dipped in the alkaline electrolytic solution so that the oil and inorganic matter adhered to the surface of the thin plate material are removed by bubbles generated at the surface. In the above-described electrocleaning, compounds on the metal surface or dust are removed by reduction on the metal surface by hydrogens generated on the surface of the thin plate material and oxidation of dust.

Figure 6:
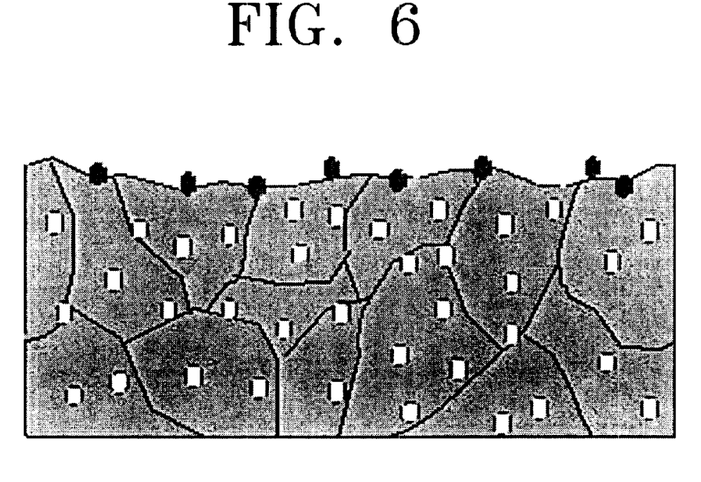
FIG. 6 is a cross-sectional view illustrating the cross section of a material after electropolishing.

The surface of the electrocleaned thin plate material is electropolished (step 40). In this embodiment, a mixed solution of phosphoric acid and nitric acid, which is a 75% acidic solution, is used as an electrolytic solution and a current of 90 A is applied to the thin plate material. If electropolishing is performed under the above-described circumstances, the surface of the thin plate material is polished in a state in which foreign matter is primarily removed by the cathodic and anodic degreasing. Thus, as shown in FIG. 6, remainder Fe nodules which are not completely melted with raw materials contained in the thin plate material during preparation of the raw materials, are exposed to the surface of the thin plate material.

In such a state in which the nodules are exposed to the surface of the thin plate material, inclusions exposed to the thin plate material are removed (step 50).

In this embodiment, the inclusion removing step (step 50) includes a third degreasing (anodic degreasing) step (step 51). In the anodic degreasing (step 51), the thin plate material is employed as an anode and a predetermined metal plate is employed as a cathode to then be immersed in the electrolytic solution. The nodules of the thin plate material are removed by oxidation and anodic dissolution, that is, by charge migration from the anode to the cathode and oxygen generated at the anode. In this embodiment, a current of 40 A is applied to 120 g/l of a NaOH solution as the electrolytic solution.

Here, the components of the inclusions producing after electropolishing may differ depending on the components of a base metal. For example, in the case of a C7025 material, Si inclusions, rather than Fe nodules, are exposed to the surface of the thin plate material after electropolishing. In this case, since Si is a non-conductive material, they are removed by radiating ultrasonic wave to the surface of the thin plate material, instead of anodic degreasing.

Figure 7:
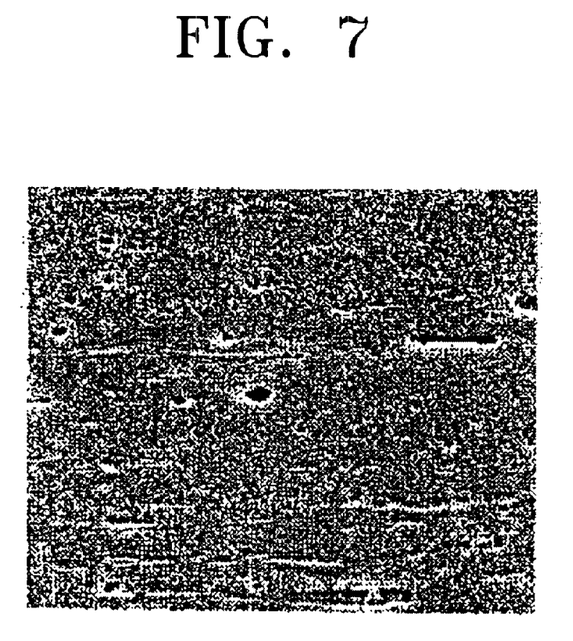
FIG. 7 shows a photograph of the surface state of a thin plate material after cathodic degreasing and anodic degreasing.
Figure 8:
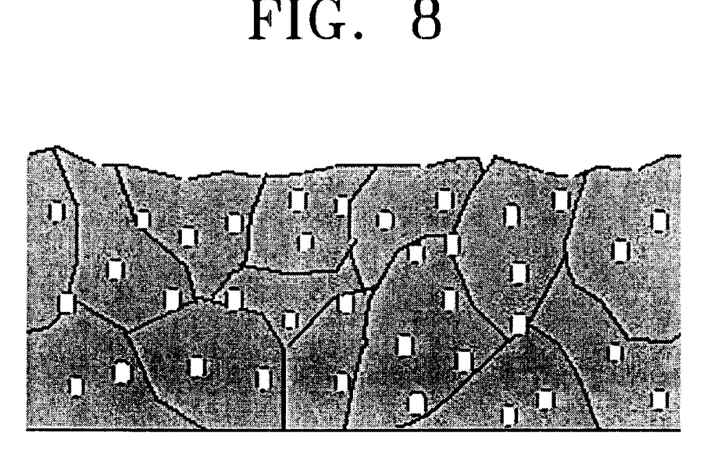
FIG. 8 is a cross-sectional view illustrating the cross section of a material after removing inclusions.

If the anodic degreasing step (step 51) is completed for inclusion removal, the thin plate material is rinsed using an acidic solution to completely wash away foreign matter (step 60). By performing the inclusion removing step as described above, the nodules are completely removed from the surface of the thin plate material, as shown in FIGS. 7 and 8. As described above, if the pre-treatment process is completed, multi-plated layers containing protective layers are formed on the thin plate material (step 70).

Figure 9:
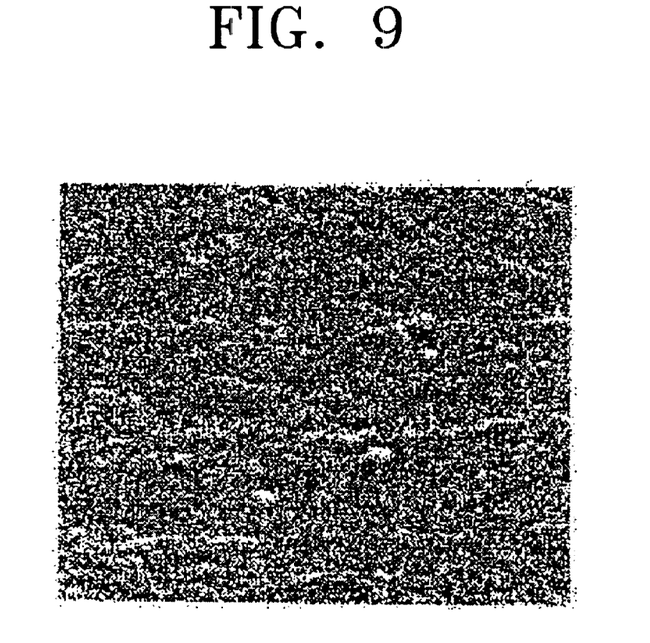
FIG. 9 shows a photograph in which a plating layer is formed on the surface of the thin plate material shown in FIG. 5.

FIG. 9 shows a photograph in which plating layers are formed on the pre-treated thin plate material.

As shown in FIG. 9, nodules are not generated at the surface of the thin plate material, from which it is understood that the roughness of the plating surface has improved. Thus, in manufacturing the lead frame using a thin plate material, nodules can be prevented from being stripped away from bent portions. Also, the plating layers can be prevented from being peeled off. Further, the nodules stripped away from the thin plate material stick to a head portion of the capillary during wire bonding, thereby preventing the capillary from being severely worn out.

The lead frame 80 manufactured by the above-described method, includes internal leads 81 connected to chips by wire bonding, and external leads 82 for being connected to external circuits, as shown in FIG. 1.

The lead frame 80 having the aforementioned configuration has improved surface roughness as nodules are removed from the surface of the material. Thus, as described above, the wearing or contamination of the capillary can be prevented. Also, a problem of poor adhesion between the plating layer and the underlying material (underlying metal), which is a primary cause of impurity in wire bonding, can be fundamentally overcome.

FIGS. 4 and 9 are enlarged views showing the surface states of a conventional lead frame and a lead frame according to the present invention, both being magnified by 3000 times, in which the width and lengths thereof are 40 $\mu$m, that is, the surface area is 1600 $\mu m^2$ and the number of nodules each having a diameter of approximately 1 $\mu$m is noticeably reduced from approximately 50 (prior art) to 0 to 5 (present invention).

FIGS. 10 through 13 show photographs obtained by conducting tests on a lead frame according to the present invention and a conventional lead frame under the conditions applied to a lead frame in a conventional semiconductor manufacturing process.

Figure 10:
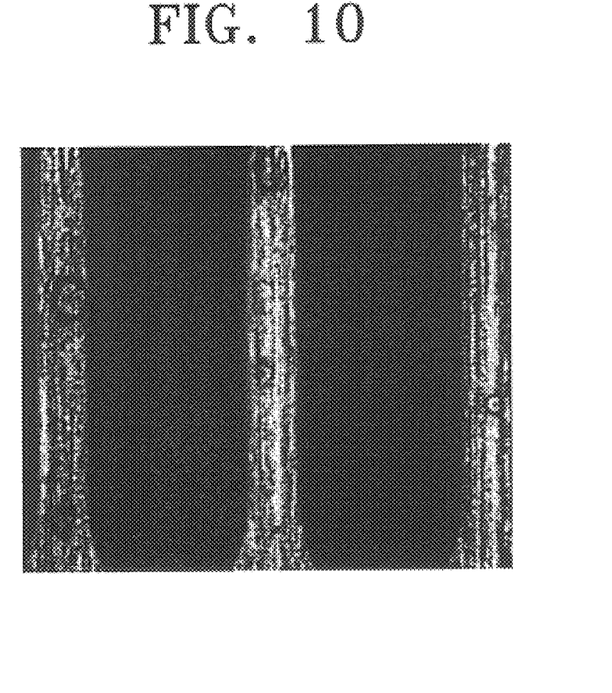
FIG. 10 shows a photograph of the surface state of a conventional lead frame on which curing and steam-aging are performed after performing multi-layer plating.
Figure 12:
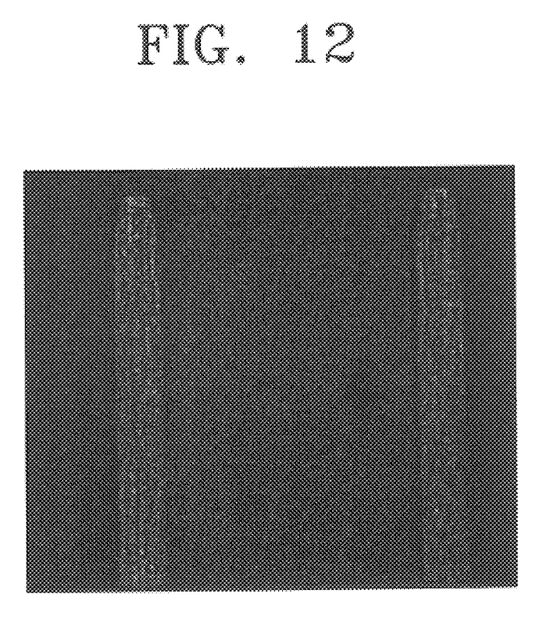
FIG. 12 shows a photograph of the surface of a present invention lead frame on which curing and steam-aging are performed after performing multi-layer plating.

First, FIGS. 10 and 12 show photographs of the surface states of a conventional lead frame and a present invention lead frame, on each of which curing is performed at an oven of 175° C. for 2 hours and steam-aging is then performed at 93° C. for 8 hours, after sequentially performing multi-layer plating of nickel and palladium.

Figure 11:
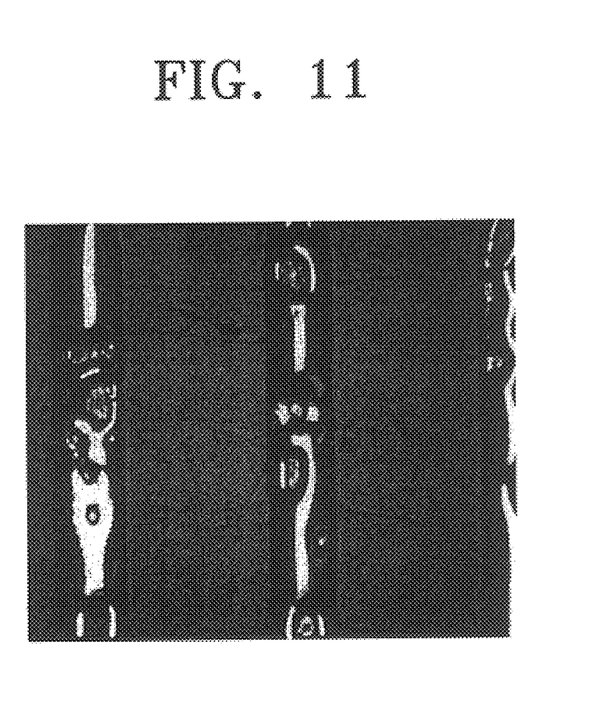
FIG. 11 shows a photograph of the solder wetting state after performing the steam-aging shown in FIG. 10.
Figure 13:
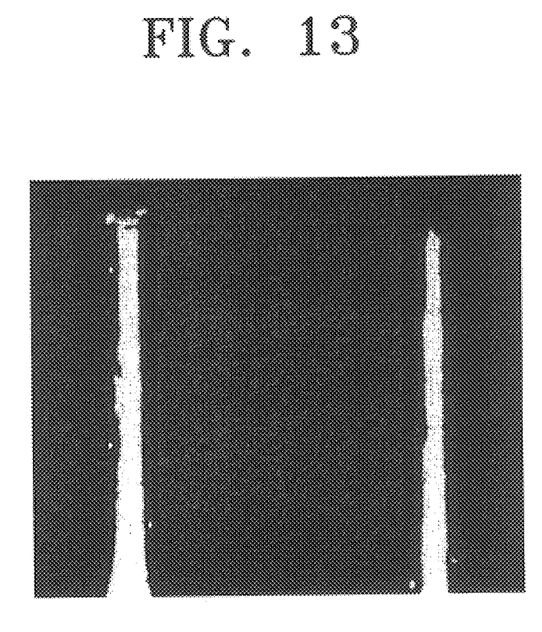
FIG. 13 shows a photograph of the solder wetting state after performing the aging shown in FIG. 12.

FIGS. 11 and 13 show photographs of the solder wetting states of a conventional lead frame and a present invention lead frame, obtained after an R-flux type solder activator is applied to the surfaces of the cured and steam-aged lead frames and the resultant lead frames are dipped into the solder fused at 235° C. for 2 seconds. As shown in the photographs, the conventional multi-layer plated lead frame having the inclusions projecting on the surface of the base metal experiences oxidation around the inclusions while being aged, thereby having low solder wettability. On the other hand, the lead frame according to the present invention has excellent solder wettability even after being aged, by removing the inclusions remaining on the surface of the base metal.

As described above, according to the multi-layer plated lead frame manufactured by the above-described method, the inclusions which may impede solder wettability due to surface mounting, are noticeably reduced from the surface, thereby solving the problem of solder wettability.

The thus manufactured semiconductor lead frame to which pre-plating is applied to a substrate has a protective layer made of precious metal on its outermost layer and intermediate underlying layers. The precious metal include palladium, palladium alloy, gold, gold alloy and the like. In the embodiment of the present invention, a palladium plated layer which is a protective layer is 0.05 to 2 $\mu$m in thickness. Here, the thickness of a nickel plated layer which is an underlying layer is 20 to 40 $\mu$m.

As described above, in the lead frame according to the present invention and the manufacturing method thereof, the nodules on the surface of a thin plate material, which deteriorate the wire bonding property during the manufacture of a semiconductor device and the solder wettability during surface mounting, are removed during a pre-treatment process, thereby preventing peeling off of a plating layer due to the nodules, generating of cracks, wearing of a capillary due to wire bonding, accumulation of the nodules on the head of the capillary, pressed marks of the plating layer during wire bonding, caused by the nodule accumulation, and so on. Further, the solder wettability of external leads during surface mounting of the lead frame can be improved and cracks due to bending can be prevented.

Although the present invention has been described with reference to an illustrative embodiment, it should be understood that the invention is not limited to the illustrated embodiment and that many changes and modifications can be made within the scope of the invention by a person skilled in the art.

What is claimed is:

1. A method for manufacturing a lead frame comprising the steps of:

electrocleaning the surface of a thin plate material;

electropolishing the electrocleaned thin plate material;

removing inclusions on the surface of the electropolished thin plate material;

rinsing the inclusion-removed thin plate material with an acidic solution; and forming multi-plated layers on the rinsed material.

2. The method according to claim 1, wherein the electrocleaning step comprises the sub-steps of:

a primary degreasing step of cathodic-degreasing the thin plate material; and a secondary degreasing step of anodic-degreasing the cathodically-degreased thin plate material.

3. The method according to claim 1, wherein the inclusion-removing step includes the step of anodic-degreasing the thin plate material.

4. The method according to claim 1, wherein when the inclusions are non-conductive, the inclusion-removing step includes removing the inclusions by radiating ultrasonic wave onto the surface of the thin plate material.

5. A lead frame having an inner lead portion and an outer lead portion formed by electropolishing a cleaned thin plate material, removing inclusion on the surface of the electropolished thin plate material having multi-plated layers, rinsing the same and forming multi-plated layers thereon.

6. A lead frame for a semiconductor device having multi-plated layers including a base metal, inclusions contained in the base metal and a precious metal plated layer formed on the surface from which the inclusions on the surface of the base metal are removed by electropolishing the surface of the base metal.

7. The lead frame according to claim 6, wherein the multi-plated layers include a nickel layer, and the precious metal plated layer is formed of one material selected from the group consisting of palladium, palladium alloy, gold and gold alloy.

8. The lead frame according to claim 7, wherein the thickness of the precious metal plated layer is 0.05 to 2 $\mu$m.

9. The lead frame according to claim 6, wherein after performing electropolishing, removing inclusions and forming the multi-plated layers, zero to five inclusions each having a diameter of approximately 1 $\mu$m remain on the surface area of 1600 $\mu m^2$ of the multi-plated layers.

* * * * *

UNITED STATES PATENT AND TRADEMARK OFFICE
CERTIFICATE OF CORRECTION

PATENT NO.    : 6,475,646 B2
DATED         : November 5, 2002
INVENTOR(S)   : Se-chul Park et al.

It is certified that error appears in the above-identified patent and that said Letters Patent is hereby corrected as shown below:

<u>Title page,</u>
Item [30], Foreign Application Priority Data, insert

-- November 17, 2000   (KR)   2000-68500 --.

Signed and Sealed this

First Day of July, 2003

JAMES E. ROGAN
*Director of the United States Patent and Trademark Office*